US010514619B2

(12) United States Patent
Bihr et al.

(10) Patent No.: US 10,514,619 B2
(45) Date of Patent: Dec. 24, 2019

(54) SENSOR ARRANGEMENT FOR A LITHOGRAPHY SYSTEM, LITHOGRAPHY SYSTEM, AND METHOD FOR OPERATING A LITHOGRAPHY SYSTEM

(71) Applicant: Carl Zeiss SMT GmbH, Oberkochen (DE)

(72) Inventors: Ulrich Bihr, Dirgenheim (DE); Markus Holz, Aalen (DE); Jan Horn, Munich (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/878,041

(22) Filed: Jan. 23, 2018

(65) Prior Publication Data
US 2018/0188656 A1     Jul. 5, 2018

Related U.S. Application Data

(63) Continuation of application No. PCT/EP2016/069688, filed on Aug. 19, 2016.

(30) Foreign Application Priority Data

Aug. 27, 2015  (DE) .................. 10 2015 216 438

(51) Int. Cl.
*G03B 27/42* (2006.01)
*G03F 7/20* (2006.01)
(Continued)

(52) U.S. Cl.
CPC ............. *G03F 7/7085* (2013.01); *G01D 5/24* (2013.01); *G02B 26/0841* (2013.01); *G03F 7/70116* (2013.01)

(58) Field of Classification Search
CPC ...... G01D 5/24; G01D 5/2405; G01D 5/2417;
G01D 5/241; H03K 17/955; H03K 17/962; H03K 17/9622; H03K 2217/960745; G01R 27/2605
See application file for complete search history.

(56) References Cited

U.S. PATENT DOCUMENTS 5,130,660 A    7/1992  Flint et al.
6,127,767 A   10/2000  Lee et al.
(Continued)

FOREIGN PATENT DOCUMENTS

CN    1523448 A    8/2004
CN    1550914 A   12/2004
(Continued)

OTHER PUBLICATIONS

International Search Report for corresponding PCT Appl No. PCT/EP2016/069688, dated Nov. 29, 2016.
(Continued)

*Primary Examiner* — Mesfin T Asfaw
(74) *Attorney, Agent, or Firm* — Fish & Richardson P.C.

(57) ABSTRACT

The disclosure provides a sensor arrangement for sensing a position of an optical element in a lithography system. The sensor arrangement includes: a first capacitive sensor device having a position-dependent variable first sensor capacitance that can be sensed using a first excitation signal; a second capacitive sensor device having a position-dependent variable second sensor capacitance that can be sensed using a second excitation signal; and a control device configured to produce the first and second excitation signals so that charges present on a parasitic capacitance associable with the first sensor device are at least partially compensated for by charges that are present on a parasitic capacitance associable with the second sensor device via a signal path outside the first and/or the second excitation signal path.

20 Claims, 12 Drawing Sheets

(51) Int. Cl.
    *G01D 5/24*     (2006.01)
    *G02B 26/08*     (2006.01)

(56) References Cited

U.S. PATENT DOCUMENTS

| | | |
|---|---|---|
| 6,326,795 B1 | 12/2001 | Matsumoto et al. |
| 2004/0169866 A1 | 9/2004 | Poultney |
| 2004/0257545 A1 | 12/2004 | Brinkhof et al. |
| 2011/0298480 A1 | 12/2011 | Kronmueller et al. |
| 2012/0044474 A1 | 2/2012 | Hauf et al. |
| 2013/0093431 A1* | 4/2013 | Raman ............... G01L 1/144 |
| | | 324/537 |
| 2013/0207677 A1* | 8/2013 | Togura ............ G01R 27/2605 |
| | | 324/685 |

FOREIGN PATENT DOCUMENTS

| | | |
|---|---|---|
| DE | 10 2008 003 342 A1 | 7/2009 |
| DE | 10 2013 209 442 A1 | 11/2014 |
| EP | 0 840 092 A2 | 5/1998 |
| EP | 2 687 906 A2 | 1/2014 |
| KR | 1998-0031896 | 7/1998 |
| WO | WO 2009/100856 A1 | 8/2009 |
| WO | WO 2010/049076 A2 | 5/2010 |

OTHER PUBLICATIONS

Chinese office action, with translation thereof, for corresponding CN App No. 201680049606.1, dated Aug. 16, 2019.
Korean office action, with translation thereof, for corresponding KR App No. 10-2018-7008160, dated Sep. 19, 2019.

* cited by examiner

SENSOR ARRANGEMENT FOR A LITHOGRAPHY SYSTEM, LITHOGRAPHY SYSTEM, AND METHOD FOR OPERATING A LITHOGRAPHY SYSTEM

CROSS-REFERENCE TO RELATED APPLICATIONS

The present application is a continuation of, and claims benefit under 35 USC 120 to, international application PCT/EP2016/069688, filed Aug. 19, 2016, which claims benefit under 35 USC 119 of German Application No. 10 2015 216 438.1, filed Aug. 27, 2015. The entire disclosure of these applications are incorporated by reference herein.

FIELD

The present disclosure relates to a sensor arrangement for sensing a situation, position and/or movement of an optical element in a lithography system, to a lithography system and to a method for operating a lithography system. Sensors in a lithography system can be used for example to sense the situation or position of optical elements, such as mirrors or lenses.

BACKGROUND

Microlithography is used for producing microstructured components, for example integrated circuits. The microlithographic process is performed using a lithography system, which has an illumination system and a projection system. The image of a mask (reticle) illuminated via the illumination system is in this case projected via the projection system onto a substrate (for example a silicon wafer) coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography systems that use light with a wavelength in the range of 0.1 nm to 30 nm, in particular 4 nm to 6 nm, are currently under development. In the case of such EUV lithography systems, because of the high absorption of light of this wavelength by most materials, reflective optical units, that is to say mirrors, have to be used instead of—as previously—refractive optical units, that is to say lens elements. For the same reason, beam shaping and beam projection should be performed in a vacuum.

The mirrors may for example be fastened to a supporting frame (force frame) and be configured to be at least partially manipulable or tiltable in order to allow a movement of a respective mirror in up to six degrees of freedom, and consequently a highly accurate positioning of the mirrors in relation to one another, in particular in the pm range. This allows changes in the optical properties that occur for instance during the operation of the lithography system, for example as a result of thermal influences, to be corrected.

Further, mirrors are used in illumination systems for lithography systems. The mirrors used then are desirably positioned precisely and the situation or position thereof sensed. For the purposes of moving the mirrors, actuators which are actuated by way of a control loop are provided for the most part. An apparatus for monitoring the tilt angle of a respective mirror using sensors is then frequently provided as part of the control loop.

For example, WO 2009/100856 A1 discloses a facet mirror for a projection exposure system of a lithography system, which has a multiplicity of individually displaceable individual mirrors. To ensure the optical quality of a projection exposure apparatus, very precise sensing and positioning of the displaceable individual mirrors is involved. Furthermore, document DE 10 2013 209 442 A1 states that a field facet mirror can be in the form of a microelectromechanical system (MEMS).

SUMMARY

Position determination often involves the use of capacitive sensor devices that are read using what are known as "switched-capacitor" reading circuits. The high excitation frequencies for actuating the capacitive sensor elements can lead to an unfavorable signal-to-noise ratio (SNR), however. The cause may be parasitic capacitances or line resistances in the respective sensor arrangement and the interconnection thereof, for example. It is more desirable to be able to use high excitation frequencies for a reading circuit, with parasitic resistances, inductances and/or parasitic capacitances being seen as perturbing.

The present disclosure seeks to provide an improved sensor arrangement and/or sensor actuation.

Accordingly, a sensor arrangement is proposed for sensing a situation or position of an optical element in a lithography system. The sensor arrangement in this case includes:

- a first capacitive sensor device that has a position-dependent variable first sensor capacitance that can be sensed using a first excitation signal; and
- a second capacitive sensor device that has a position-dependent variable second sensor capacitance that can be sensed using a second excitation signal.

The sensor arrangement further includes a control device that is set up to produce the first and second excitation signals such that charges that are present on a parasitic capacitance associable with the first sensor device are at least partially compensated for by charges that are present on a parasitic capacitance associable with the second sensor device via a balancing path outside the first and/or the second excitation signal path.

Each sensor device in particular has a respective associated reading device.

In the case of capacitive sensor devices, the sensor capacitance thereof change on the basis of a mechanical influence, for example a displacement, deflection or a shift in capacitor elements relative to one another. The production of the first and second excitation signals such that parasitic charges compensate for one another via electrical connections that are not in the excitation signal path allows increased excitation frequencies to be realized for a reading circuit. It can be said that the two excitation signals are produced and coupled in a manner "balanced" in relation to one another. When a respective sensor device is read by an evaluation device, a sensed measurement voltage corresponds to the respective sensor capacitance.

In this respect, for example the first reading device associated with the first sensor device senses a measurement charge accumulated on the first sensor capacitance on the basis of the coupled-in first excitation signal, and the second reading device associated with the second sensor device senses a measurement charge accumulated on the second sensor capacitance on the basis of the coupled-in second excitation signal.

A first excitation signal, for example a rising voltage on elements of a sensor device, allows charges to build up on the basis of the parasitic capacitance. It is now proposed that a method for operating the sensor arrangement, for example, be used to produce the excitation signals such that accumulated charges on different sensor devices compensate for one another. Since the accumulated parasitic charges drain not via the excitation signal path, that is to say via connecting lines to the respective capacitors of the sensor device, but rather via a separate path, parasitic charges on parasitic capacitors are dissipated quickly, which means that the voltage level that is coupled in on the input side by the respective actuation signal is quickly reached at the output of the respective capacitive sensor device. Consequently, the respective sensor capacitance carries the accumulated measurement charge, which is used as a measure of a deflection, situation or position of the optical element under consideration. Reading electronics, for example a switched-capacitor circuit, sense this measurement charge and deliver a measurement voltage signal for further processing.

A parasitic capacitance is understood to mean in particular a capacitance that allows charge accumulation that results in a measurement charge other than that accumulated according to the actual sensor capacitance possibly being ascertained. Capacitances that are not present between two capacitor elements between which the sensor capacitance is measured or sensed can be understood as parasitic or stray capacitances.

The first and second excitation signals are the inverse of one another with regard to an offset potential, for example. In embodiments in which the offset potential is ground or disappears, the first and second excitation signals are the inverse of one another. By way of example, a pulsed signal shape may be provided for the excitation signal, the first excitation signal having a positive voltage pulse and the second having a negative voltage pulse, for example. As a result, parasitic capacitances in the sensor arrangement are charged oppositely to one another. That is to say that the accumulated (parasitic) charges can cancel one another out via a suitable electrical signal path.

In embodiments, the first and/or the second excitation signal is an AC voltage signal, in particular a square-wave signal. Pulse or AC voltage frequencies between two and three megahertz are conceivable, for example. In embodiments, frequencies from 0.5 to 3.0 megahertz, preferably between 2.4 and 2.6 megahertz, are used.

In a further embodiment of the sensor arrangement, the first and/or the second excitation signal is a voltage signal having a prescribed nominal voltage characteristic over a prescribed excitation period. The voltage is set relative to a reference potential, for example, which is likewise delivered to the sensor device by the control device. The respective voltage signal having a nominal voltage characteristic, for example a square-wave pulse shape, results in the capacitive sensor device being charged. From this, an output voltage signal that is used for position determination is again sensed or ascertained via a, for example differential, reading circuit. The output voltage signal is in particular supplied to an analog-to-digital converter for further processing.

The respective amplitude or the absolute value of the voltage signal for the first and second excitation signals may be the same. In this case, the amplitude can be understood as the absolute value of the difference between the respective potential of the voltage signal and a reference potential. In embodiments, an amplitude of the voltage signal in a first excitation section of the excitation period is set to be greater than the nominal amplitude corresponding to the nominal voltage characteristic. It can be said that a type of overshoot is effected in the first excitation section, which means that the capacitances of the capacitive sensor device are charged particularly quickly. As a result, an even higher excitation frequency can be attained, since the sensor capacitances adopt their steady state in accelerated fashion. A nominal voltage characteristic can then have an offset component that in particular corresponds to the respective reference potential.

In this respect, the amplitude of the voltage signal in a second excitation section can correspond to the nominal amplitude. The first and second excitation sections then together form the excitation period. It is further possible for the first and/or the second excitation signal to correspond to a reference potential between successive excitation periods over a prescribed pause period. Therefore, pulsed excitation signals having different time characteristics are possible. Within the excitation period, which can correspond to a period, a duty ratio can be stipulated as a result of the stipulation of the first and second excitation sections. By way of example, the first excitation section is shorter than the second excitation section.

Preferably, the amplitude of the first and second excitation signals is set on the basis of sensed parasitic capacitances. In case of a symmetrical configuration of the first and second sensor devices, it can be assumed that the parasitic capacitances are approximately the same in terms of absolute value. The antiphase actuation or coupling-in of excitation signals having the same amplitude but different arithmetic signs can then result in compensation for parasitic charges.

In embodiments, the sensor arrangement further has a base element and a structural element for retaining an optical element and a bearing element for movably supporting the structural element on the base element. The sensor arrangement can support mirrors as optical elements with a surface area of a few square millimeters and determine a tilt angle or inclination angle, for example. A suitable optical element is in particular a mirror in a facet mirror arrangement.

The structural element, the bearing element and the base element may be manufactured from a semiconductor, in particular from silicon material. In this respect, the sensor arrangement can be produced as a semiconductor component. By way of example, the bearing element is a spring-like structure in the center of a surface that can be inclined by different rotation or tilt angles using the spring-like structure. The structural element is part of an MEMS, for example.

In embodiments of the sensor arrangement, the first or the second sensor device has at least a first and a second capacitor element, which are fixed relative to one another, and a third capacitor element that is movable relative to the first and second capacitor elements. The sensor capacitance then appears between the first and second capacitor elements on the basis of a position of the capacitor elements in relation to one another.

The sensor capacitance in particular becomes able to be sensed using the excitation signal, which can be coupled to the first and second capacitor elements via supply lines. By way of example, fixed capacitor elements may be provided at a distance from one another, so that a third movable one engages in the interspace between the two capacitor elements and alters a sensor capacitance depending on the position in the interspace. Moreover, a parasitic capacitance can arise between the first and third and between the second and third capacitor elements that, in the conventional case, can lead to impairment of operation.

In embodiments, the first and second capacitor elements are arranged on the base element, and the third capacitor element is arranged on the structural element. The structural element can be inclined or tilted relative to the base element in the style of a plate, for example, using the bearing device. In this case, the base element, the structural element and the bearing device are preferably formed integrally. Further, for example in the case of a semiconductor-based or silicon-based sensor arrangement, electrical supply lines and outgoing lines may be incorporated. The bearing device may in particular include doped silicon material.

In embodiments, the first and second sensor devices are embodied in differential fashion, and the sensor devices are arranged to sense two different tilt movements. By way of example, a first differential sensor device can include sensor capacitance pairs that are arranged relative to a tilt or inclination point. Preferably, the two differential sensor devices are set up to sense inclinations or tilt axes situated perpendicular to one another.

In embodiments, the first and second capacitor elements are individually contactable using supply lines provided in or on the base element. The third capacitor elements are, in particular, electrically coupled to one another via the structural element. Since, in particular, parasitic charges arise on the third capacitor elements, charge balancing is effected at least in part via the structural element, in particular if the respective excitation signals are "balanced". That is to say that the charges brought about by the excitation signals have different arithmetic signs, which means that they balance via a balancing path and the parasitic capacitances now cause only minor perturbation.

In accordance with a further aspect of the present disclosure, a lithography system having at least one optical element and a sensor device as described above or below is proposed.

The sensor device in this arrangement is used to sense the position of the optical element. The lithography system can further include a radiation source or an illumination device. In this respect, the lithography system is equipped with a sensor arrangement that uses capacitive sensors to allow the measurement of the position or of a tilt angle of the optical element. Preferably, the electrodes or the capacitor elements of the capacitive sensor are in the shape of a comb and are arranged in intermeshed fashion.

The control device is in particular implemented as an ASIC.

Additionally proposed is a method for operating a lithography system. This involves at least one of the following steps being performed:
  producing the first and second excitation signals such that charges that are present on the capacitance associable with the first sensor device are at least partially compensated for by charges that are present on the parasitic capacitance associable with the second sensor device via a signal path outside the first and/or the second excitation signal path;
  sensing the first and second sensor capacitances; and/or
  determining an inclination or position of the optical element on the basis of the sensed first and second sensor capacitances.

The optical component can be in particular a micromirror, having a side length of less than 1 mm. The mirror or micromirror can in particular be part of a multi-mirror array (MMA). MMAs having more than 500 individual mirrors are conceivable. The MMA can also include more than 100, in particular more than 1000, in particular preferably more than 10 000 such mirrors, however. In particular, these can be mirrors for reflecting EUV radiation.

The optical component can therefore also be part of a facet mirror, in particular a field facet mirror, of a beam-shaping and illumination system of the lithography system. In this case, the optical element is arranged in particular in an evacuable chamber. During operation of the lithography system, said evacuable chamber can be evacuated in particular to a pressure of less than 50 Pa, in particular less than 20 Pa, in particular less than 10 Pa, in particular less than 5 Pa. This pressure gives in particular the partial pressure of hydrogen in the evacuable chamber.

The radiation source used in a lithography system is in particular an EUV radiation source having emitted effective radiation in the region between 0.1 nm and 30 nm, preferably between 4 and 6 nm. This can be a plasma source, for example a GDPP (Gas Discharge Produced Plasma) source or an LPP (Laser Produced Plasma) source. Other EUV radiation sources, for example based on a synchrotron or on a free electron laser (FEL) are possible.

In accordance with one embodiment, the lithography system is an EUV lithography system.

In a development, the individual mirrors are displaceable, in particular positionable, in each case via an actuator device with multiple electromagnetically, in particular electrostatically, operating actuators. The actuators can be produced in a batch process as a microelectromechanical system (MEMS). For details, reference is made to document WO 2010/049 076 A1, the content of which is incorporated herein. To form the field facet mirror and to form the pupil facet mirror, reference is made to DE 10 2013 209 442 A1, the content of which is incorporated herein.

The embodiments and features described for the proposed apparatus are correspondingly applicable to the proposed method.

A computer program product, such as e.g. a computer program device, can be provided or supplied, for example, as a storage medium, such as e.g. a memory card, a USB stick, a CD-ROM, a DVD, or else in the form of a downloadable file from a server in a network. By way of example, in the case of a wireless communications network, this can be effected by transferring an appropriate file with the computer program product or the computer program device.

The respective unit, for example a control device, evaluation unit or reading unit, may be implemented in hardware and/or in software. It is also possible for just parts of the control or evaluation electronics to be implemented in software. If the implementation is in hardware, the respective unit can be in the form of an apparatus or part of an apparatus, such as a computer or a microprocessor, or in the form of a control computer of a lithography system. If the implementation is in software, the respective unit can be in the form of a computer program product, in the form of a function, in the form of a routine, in the form of part of a program code or in the form of an executable object.

Furthermore proposed is a computer program product that initiates the operation of a lithography system of the method as explained above on a program-controlled device in a manner such that the first and second excitation signals are coupled in a manner balanced in relation to one another.

Further possible implementations of the disclosure also include not explicitly mentioned combinations of features or embodiments that are described above or below with respect to the exemplary embodiments. In this respect, a person skilled in the art will also add individual aspects to the respective basic form of the disclosure as improvements or additions.

BRIEF DESCRIPTION OF THE DRAWINGS

Further advantageous configurations and aspects of the disclosure are the subject of the subclaims and also of the exemplary embodiments of the disclosure described below. In the text that follows, the disclosure is explained in more detail on the basis of preferred embodiments with reference to the accompanying figures.

DETAILED DESCRIPTION

Identical elements or elements having an identical function have been provided with the same reference signs in the figures, unless indicated otherwise. It should also be noted that the depictions in the figures are not necessarily to scale.

Figure 1:
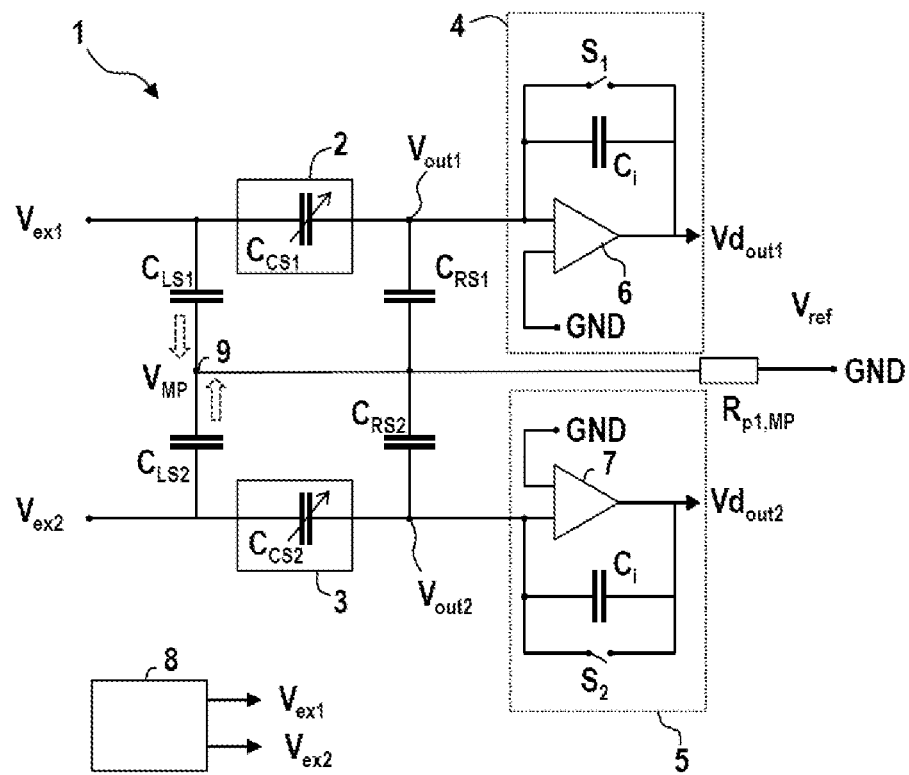
FIG. 1 shows a schematic depiction of a first embodiment of a sensor arrangement.

FIG. 1 shows a schematic depiction of a first embodiment of a sensor arrangement in a possible single-ended configuration. The sensor arrangement 1 in this case includes two sensor devices 2, 3. A respective sensor device 2, 3 delivers a variable sensor capacitance $C_{CS1}$ or $C_{CS2}$. In the signal path from left to right, each sensor device 2, 3 has a reading device 4, 5 arranged downstream of it. Further, a control device 8 is provided that produces excitation or reading signals $V_{ex1}$, $V_{ex2}$. The control device 8 can perform further functions, for example can deliver control or switching signals.

Normally, besides the respective sensor capacitance $C_{CS1}$, $C_{CS2}$, there are also further parasitic capacitances present. Parasitic capacitances are conceivable based on a potential $V_{MP}$, for example, that may be present on a retaining plate, for example, which itself has a resistance $R_{p1,\ MP}$ and is connected to ground GN. Parasitic capacitances $C_{LS1}$ and $C_{RS1}$ are present between the respective line that is at the potential $V_{MP}$ and an input and output of the sensor device 2. Analogously, the second sensor device 3 can be assigned parasitic capacitances $C_{LS2}$ and $C_{RS2}$.

If an excitation signal $V_{ex1}$ is now coupled to the first sensor device 2, measurement charges initially accumulate on the sensor on the basis of the sensor capacitance value $C_{CS1}$, and an output voltage $V_{out1}$ appears. When $V_{ex2}$ is coupled to the second sensor capacitance $C_{CS2}$ or to the second sensor device 3, there is similarly a resultant measurement charge accumulation and an output signal $V_{out2}$. Using a respective reading circuit 4, 5 based on an SC (switched capacitor) technology, for example, the measurement charges are integrated to produce an output signal $Vd_{out1}$ or $Vd_{out2}$. The output signal $Vd_{out1}$ or $Vd_{out2}$ can be regarded as a measure of a deflection or positional change that results in the particular sensor capacitance $C_{CS1}$ or $C_{CS2}$ or in the measurement charges accumulated on the basis of the coupled-in excitation signal $V_{ex1}$, $V_{ex2}$.

The sensor arrangement depicted in FIG. 1 allows a positional change to be sensed with each of the sensor devices 2, 3 independently of one another. The reading circuits 4, 5 use an operational amplifier 6, 7 to integrate the input signal. The input side of the operational amplifier 6, 7 is supplied with the reference potential or ground GND and also with the respective voltage $V_{out1}$ and $V_{out2}$ that can be tapped off at the respective output of the sensor device 2, 3. An integration capacitor $C_i$ and a controllable switch $S_1$ or $S_2$ are used to accomplish the signal integration. The output of the operational amplifier 6 then provides the signal $Vd_{out1}$ and the output of the operational amplifier 7 provides the signal $Vd_{out2}$. When switches $S_1$, $S_2$ are open, voltage pulses are coupled in as excitation signals $V_{ex1}$, $V_{ex2}$. This is effected by the control device 8. The charge accumulated as a result on the integration capacitor $C_i$ is converted by the integration into a voltage that can be tapped off as output signal $Vd_{out1}$, $Vd_{out2}$.

The parasitic capacitances $C_{LS1}$, $C_{RS1}$, $C_{LS2}$, $C_{RS2}$ have a perturbing effect during operation of the sensor arrangement. The reason is that the additional capacitances firstly distort the charge integrated using the evaluation circuit, and secondly it takes longer before the voltage levels of the excitation signals $V_{ex1}$, and $V_{ex2}$ are present as $V_{out1}$ and $V_{out2}$ at the inputs of the operational amplifiers 6, 7. The control device 8 is now used to produce the excitation signals $V_{ex1}$ and $V_{ex2}$ in mutually complementary or "balanced" fashion. This is effected such that charge carriers that form on the parasitic capacitances $C_{LS1}$, $C_{RS1}$ are substantially balanced by charge carriers that accumulate on the capacitances $C_{LS2}$ and $C_{RS2}$. As indicated in FIG. 1 via the dashed block arrows, the charges can balance, so that the parasitic capacitances $C_{LS1}$, $C_{LS2}$, now have barely any perturbing influence for the sensor reading and the determination of the sensor capacitances $C_{CS1}$, $C_{CS2}$. Furthermore, parasitic charges that are present can drain via the resistor $R_{p1,MP}$.

By way of example, the first and second excitation signals $V_{ex1}$ and $V_{ex2}$ can be produced so as to be the inverse of one another.

Figure 2:
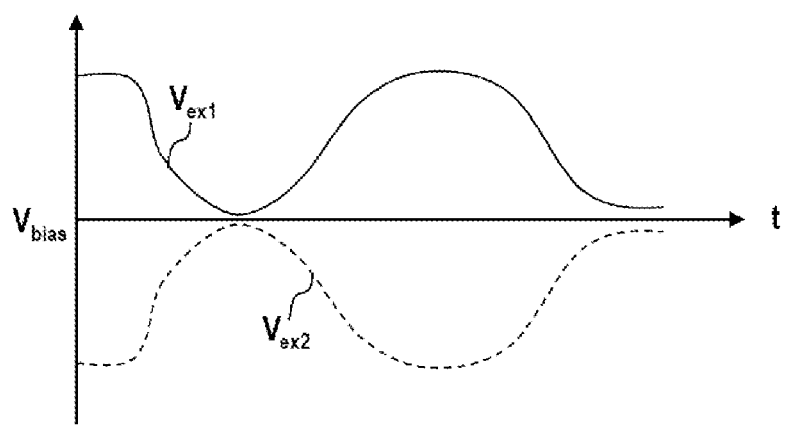
FIG. 2 shows an exemplary signal shape for excitation signals in a sensor arrangement.

FIG. 2 provides an exemplary depiction for a signal shape for excitation signals. While the first excitation signal $V_{ex1}$ has a positive "amplitude" for a potential offset potential $V_{bias}$, the second excitation signal $V_{ex2}$ has a negative "amplitude". As a result, the charges accumulated on the capacitor $C_{LS1}$ and the charges accumulated on the capacitor $C_{LS2}$ can, as indicated in FIG. 1, for example, cancel one another out at the line node 9. All in all, in this arrangement, charge balancing for the parasitic charges is effected not via the reading signal path, that is to say between the coupling connection $V_{ex1}$ and the input on the operational amplifier 6, but rather outside it. Since the sensor arrangement 1 includes two sensor devices 2, 3 that are actuated in balanced fashion, both the critical supply line resistance and the capacitor influences by parasitic capacitances are minimized. Consequently, higher excitation frequencies at a more favorable signal-to-noise ratio are possible.

The embodiment indicated as a "single-ended" sensor arrangement 1 in FIG. 1 can be used to sense tilt angles or inclinations in different inclination axes for mirrors, for example. The sensor arrangement 1 can be used in a lithography system as shown in FIG. 3, for example.

Figure 3:
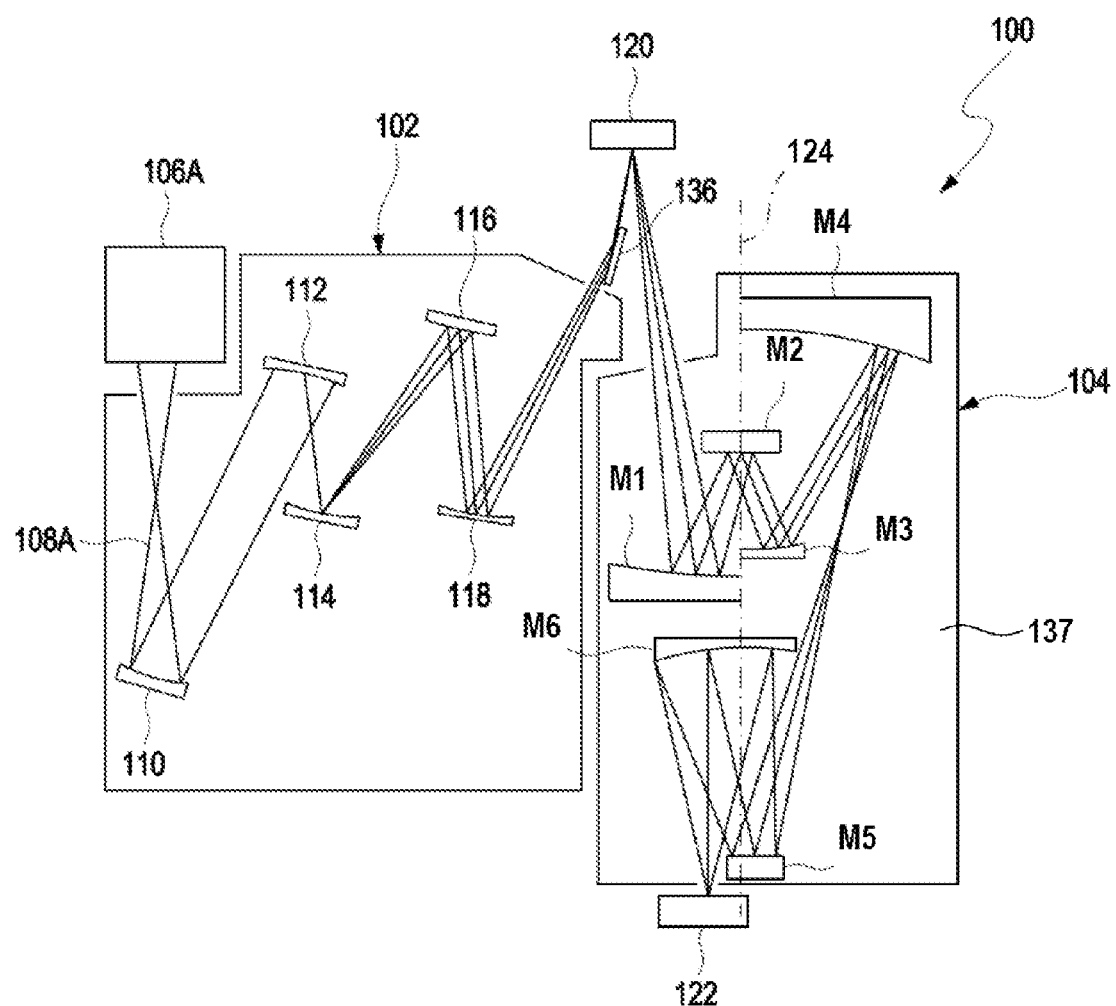
FIG. 3 shows a schematic view of an EUV lithography system.

FIG. 3 shows a schematic view of an EUV lithography system 100, which includes a beam-shaping and illumination system 102 and a projection system 104. EUV stands for "extreme ultraviolet" and refers to a wavelength of the operating light of between 0.1 and 30 nm. The beam-shaping and illumination system 102 and the projection system 104 are respectively provided in a vacuum housing, each vacuum housing being evacuated using an evacuation apparatus that is not depicted more specifically. The vacuum housings are surrounded by a machine room not depicted in any more detail. Electrical controllers and the like can also be provided in this machine room.

The EUV lithography system 100 includes an EUV radiation source or EUV light source 106A. A plasma source which emits radiation 108A in the EUV range (extreme ultraviolet range), that is to say for example in the wavelength range of 5 nm to 30 nm, may for example be provided as the EUV light source 106A. In the beam-shaping and illumination system 102, the EUV radiation 108A is focused and the desired operating wavelength is filtered out from the EUV radiation 108A. The EUV radiation 108A produced by the EUV light source 106A has a relatively low transmissivity through air, for which reason the beam guiding spaces in the beam-shaping and illumination system 102 and in the projection system 104 are evacuated.

The beam-shaping and illumination system 102 depicted in FIG. 3 has five mirrors 110, 112, 114, 116, 118. After passing through the beam-shaping and illumination system 102, the EUV radiation 108A is directed onto the photomask (reticle) 120. The photomask 120 is likewise formed as a reflective optical element and can be arranged outside the systems 102, 104. Furthermore, the EUV radiation 108A can be directed onto the photomask 120 via a mirror 136. The photomask 120 has a structure which is imaged onto a wafer 122 or the like in a reduced fashion via the projection system 104.

The projection system 104 has six mirrors M1-M6 for imaging the photomask 120 onto the wafer 122. In this case, individual mirrors M1-M6 of the projection system 104 may be arranged symmetrically in relation to the optical axis 124 of the projection system 104. It should be noted that the number of mirrors of the EUV lithography system 100 is not restricted to the number depicted. A greater or lesser number of mirrors can also be provided. Furthermore, the mirrors M1-M6 are generally curved on their front side for beam shaping.

In particular for the mirrors 110, 112, 114, 116, 118 provided in the illumination system 102, it is possible for facet mirrors to be used. In facet mirrors, larger surfaces are covered by small mirror elements, each mirror element having its position controlled using actuators. In order to actuate the actuators, which are not explained in more detail below, in a specific and useful manner, it is desirable to reliably sense the position, and in particular the tilt angles, of the mirror elements in a facet array. Since high reading and excitation frequencies are desired, the proposed method and the sensor arrangement for compensating for stray capacitance influences or parasitic resistance influences are particularly suitable in this regard.

A second embodiment for a sensor arrangement and the actuation thereof and a method for operating the sensor arrangement is described with reference to FIG. 4-8. In this context, the individual figures are used to explain partly different aspects of the embodiment.

Figure 4:
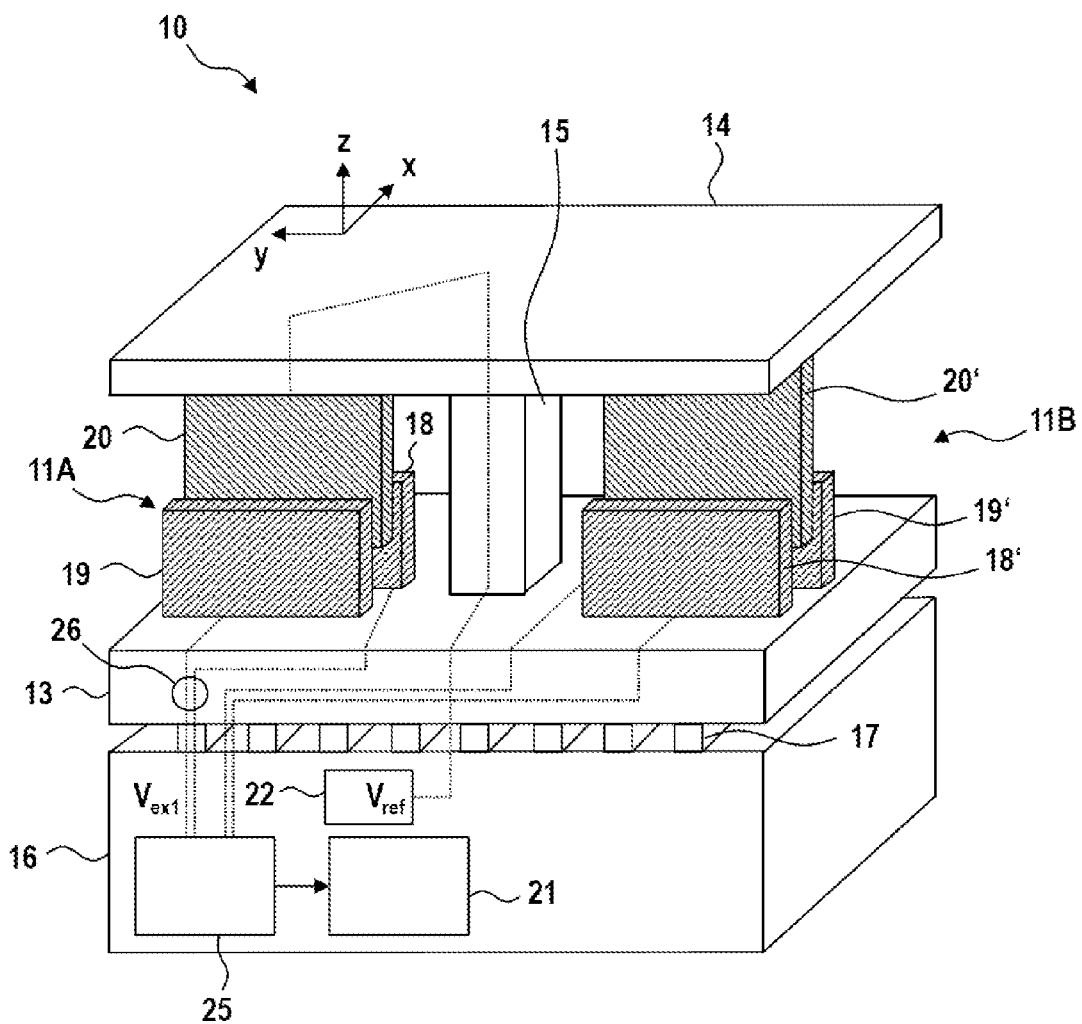
FIG. 4 shows a first schematic depiction of a part of a second embodiment of a sensor arrangement for a lithography system.

FIG. 4 now shows a first schematic depiction of a part of an embodiment of a sensor arrangement for a lithography system. FIG. 4 depicts an MEMS (microelectromechanical system) element 10. In this case, the sensor arrangement or the MEMS 10 includes a base element 13 and a structural element 14. The two elements 13, 14 are coupled to one another via a bearing device 15, so that the structural element 14 is movable.

The structural element 14 is used to secure a mirror thereto, for example. The term mirror plate (MP) is also used. By way of example, the structural element 14 or the mirror plate 14 can be inclined about the x-axis. To sense this inclination angle, a differential capacitive sensor device 11A, 11B is provided. The sensor device 11A, 11B is provided between the two plate-shaped base and structural elements 13, 14. A first part of the differential capacitive sensor device 11A includes two capacitor elements 18, 19 that are mounted on or atop the base element 13 and project therefrom. A sensor device of the same type of design for sensing the inclination about the y axis is suppressed in FIG. 4.

The capacitor elements 18, 19 are plate-shaped and form an interspace in which a third capacitor element 20 engages, from the top in the orientation of FIG. 4. The third capacitor element 20 is mounted on the movable mirror plate 14. The second part of the sensor device 11B is of symmetrical design in respect of the bearing device 15, which may be in the form of a bar or spring element. There is in turn provision for two capacitor elements 18', 19' secured to the base element 13, and a third capacitor element 20' can be arranged in the interspace from the top.

Figure 5:
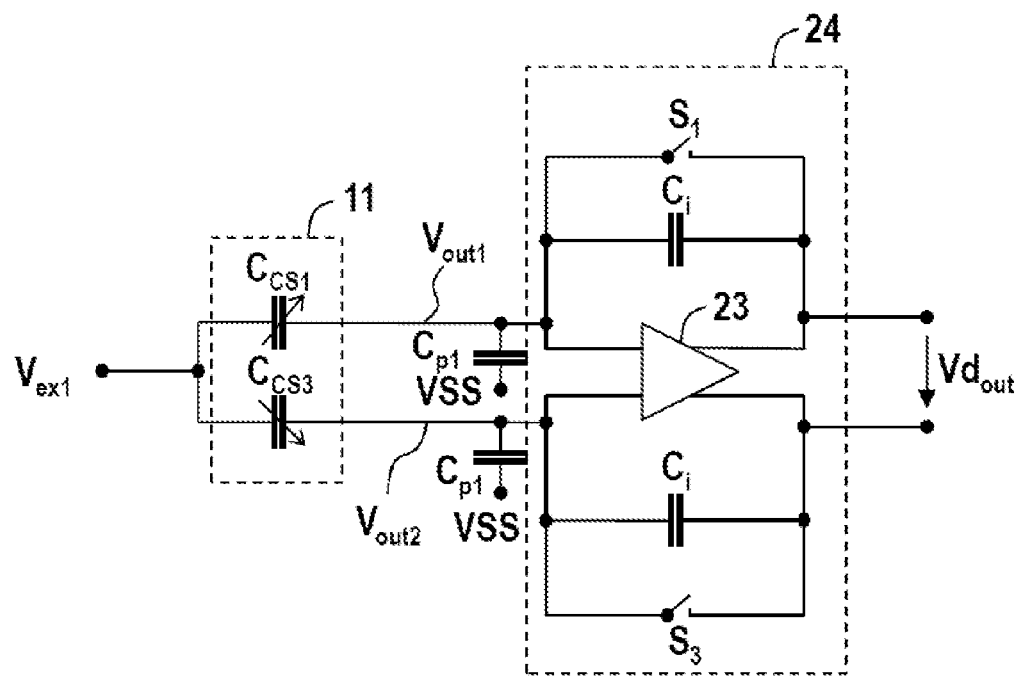
FIG. 5 shows a schematic equivalent circuit diagram for the part of the second embodiment of a sensor arrangement as shown in FIG. 4.

The respective first and second capacitor elements 18, 19, 18', 19' effectively form a plate capacitor, the capacitance of which changes as a result of the position of the third capacitor element 20, 20'. Consequently, different measurement charges that can be sensed accumulate, depending on the position of the capacitor elements 18, 19, 18', 19' in relation to one another, when an excitation signal is applied as a voltage pulse. FIG. 5 depicts as 11 a schematic equivalent circuit diagram for a selection of the part of the differential capacitive sensor device 11A, 11B shown in FIG. 4.

Coupled to the bottom of the base element 13 via contacts 17, such as a contact array, for example, are evaluation electronics 16. The evaluation electronics 16 include in particular a control device 25 that produces excitation and reading signals that are routed to the electrodes or capacitor elements 18, 19, 18', 19' via lines 26. A reference potential device 22 delivers a reference potential that is likewise routed via lines, depicted in dots in FIG. 4, for example to the mirror plate 14.

The control device 25 now delivers an excitation signal $V_{ex1}$ to the two sensor capacitances $C_{CS1}$, $C_{CS3}$. FIG. 5 schematically depicts this. FIG. 5 further shows a few parasitic capacitances $C_{p1}$ that couple to the lines 26. In the differential configuration of the sensor device 11, the reading is effected using differential reading electronics 24. To this end, a differential operational amplifier 23 is provided, the input side of which has the outputs of the sensor capacitances $C_{CS1}$ and $C_{CS2}$ coupled to it. The respective line node has the steady-state voltage $V_{out1}$, $V_{out2}$ applied to it, which, after the capacitances $C_{CS1}$ and $C_{CS2}$ are charged, corresponds to the value of $V_{ex1}$ that is supplied to the sensor device 11 as excitation signal. On the output side, it is then possible to tap off an output signal $V_{dout}$, which is a measure of the inclination about the x axis. As has already been explained for FIG. 1, the control device 25 uses suitable control signals to control the switches $S_1$ and $S_3$ such that the integration capacitors $C_i$ are used to integrate the measurement charge present on the sensor and the value that is present on the output side for the output voltage $V_{dout}$ can be used as a measure of the capacitance difference between $C_{CS1}$ and $C_{CS3}$ and hence the different measurement charges.

Although not explicitly indicated in FIG. 4, parasitic capacitances arise between the plates 18 and 20, 19 and 20 and 18' and 20', 19' and 20'. The output signal $V_{dout}$ sensed by the control device 25 using the differential evaluation circuit 24 is supplied as an analog signal to an analog-to-digital converter, denoted by 21. The digitized values can then be supplied to a further control computer or to a regulating device for the optical elements in the lithography system. The sensor arrangement may in particular be part of an active position controller for mirror elements in an illumination system.

Figure 6:
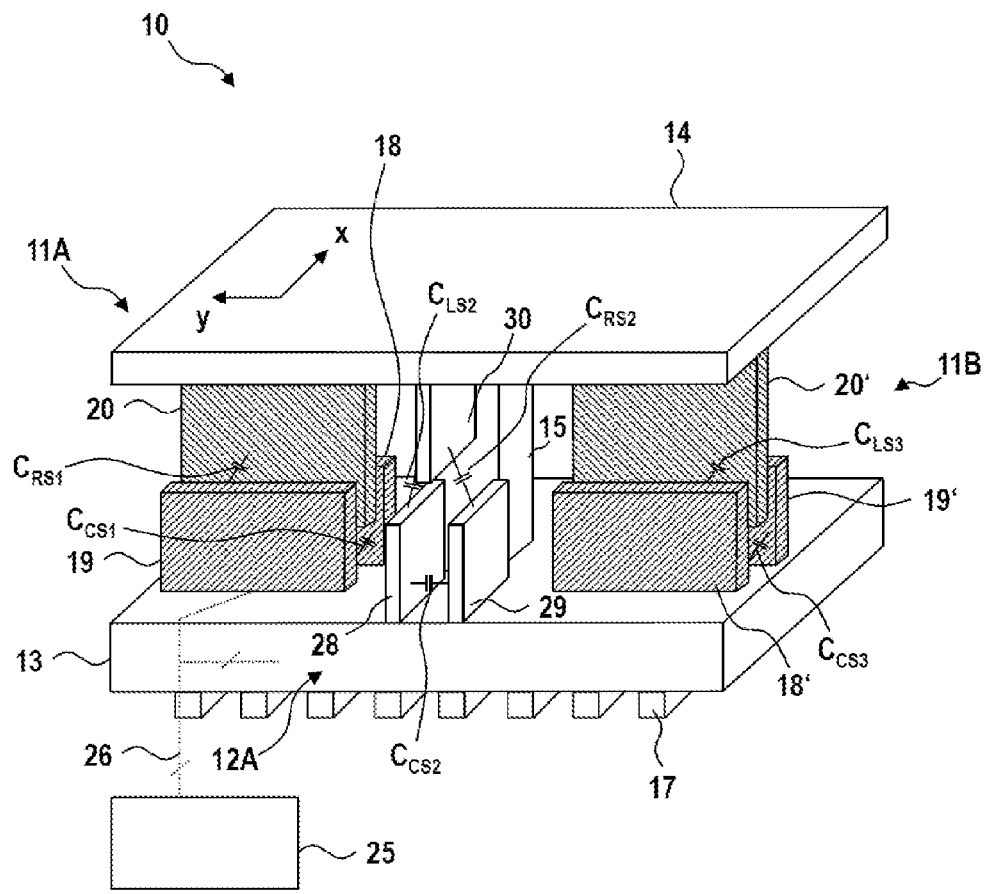
FIG. 6 shows a second schematic depiction of a part of the second embodiment of a sensor arrangement for a lithography system.
Figure 7:
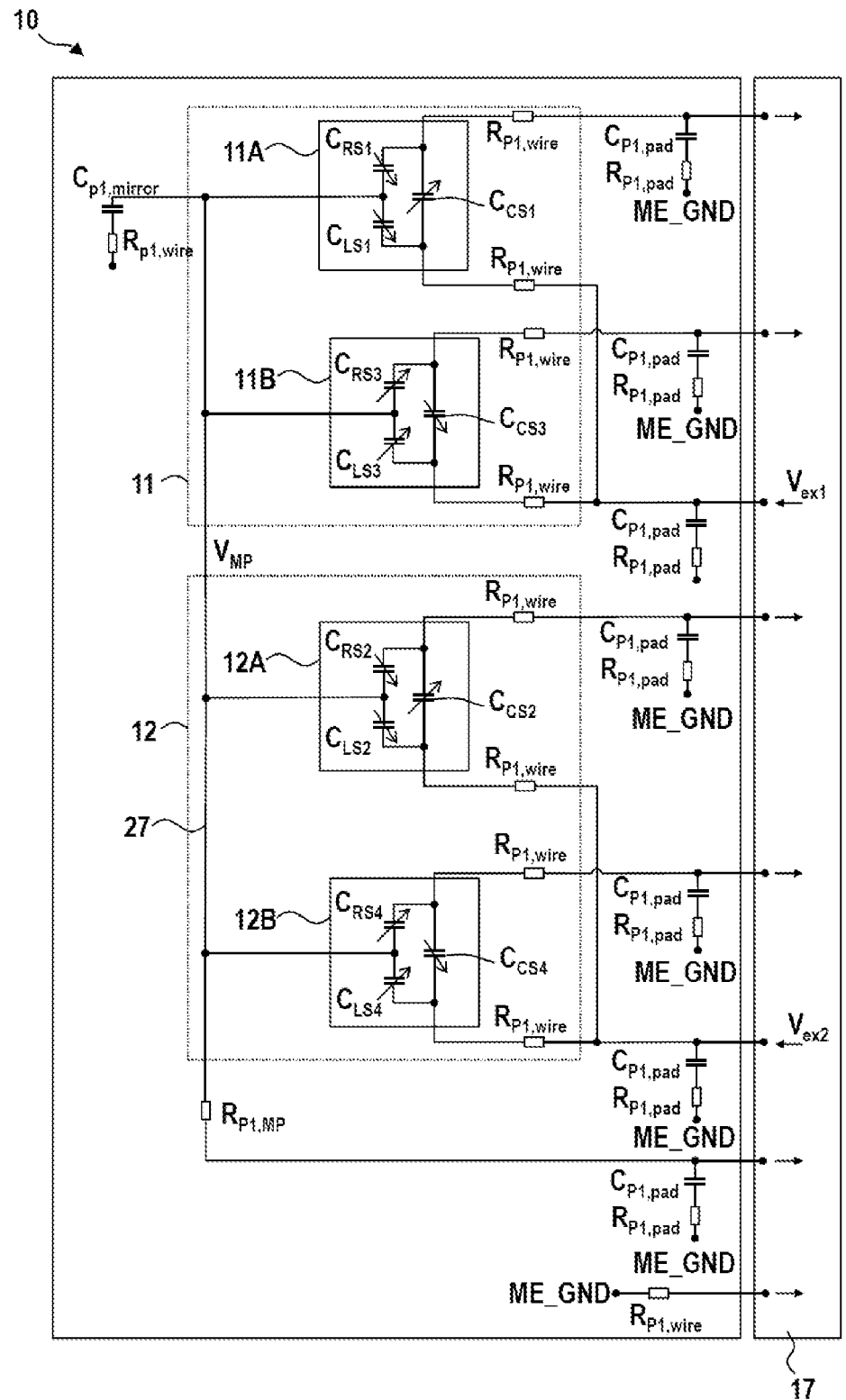
FIG. 7 shows a schematic equivalent circuit diagram for the second embodiment of a sensor arrangement.
Figure 8:
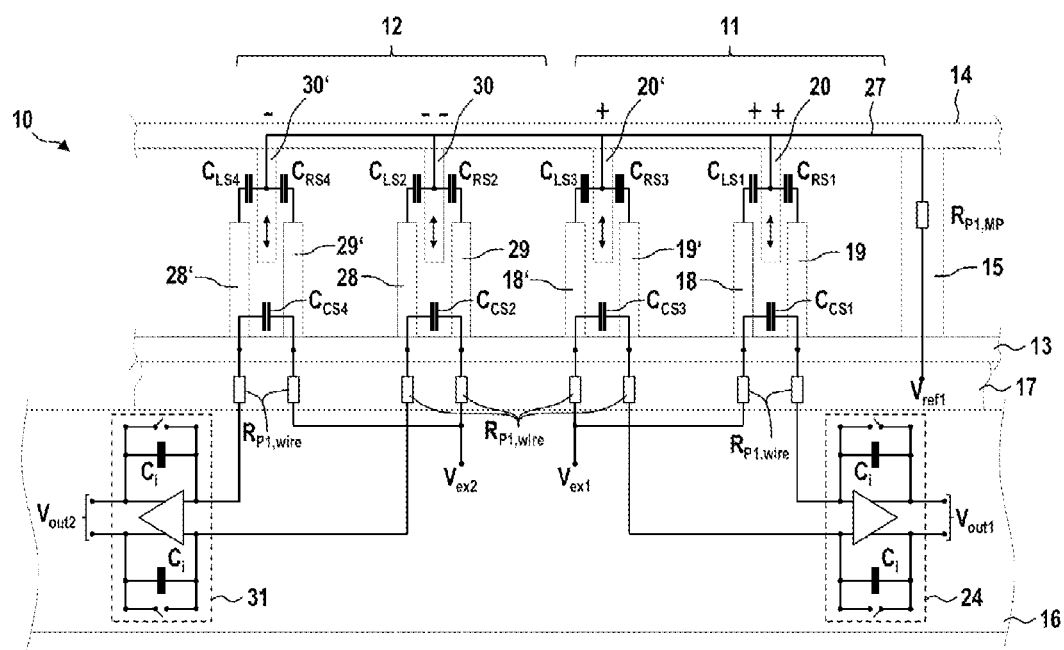
FIG. 8 shows a simplified schematic equivalent circuit diagram for the second embodiment of a sensor arrangement.

FIG. 6 shows an expanded schematic depiction of a part of the second embodiment of the sensor arrangement 10 for a lithography system. The full evaluation electronics are omitted in this case for the sake of clarity. In addition to what is already depicted in FIG. 4, a part of a second sensor device 12 is reproduced. FIGS. 7 and 8 show corresponding equivalent circuit diagrams for the whole arrangement. While the first differential sensor device 11A, 11B can detect a tilt movement about the x axis, the second differential sensor device 12, 12A, 12B is provided such that a tilt movement about the y axis can be sensed capacitively.

In the depiction of FIG. 6, it is possible to see only the front part with two fixed capacitor elements 28, 29 and a third capacitor element 30 that can be introduced between the two capacitor elements 28, 29 from the top. The function is analogous to the sensing of the tilt angle about the x axis that is described with regard to FIGS. 4 and 5. In FIG. 6, the supply lines 26 are now indicated schematically by a dotted line. The capacitor elements 18, 19, 20, 18', 19', 20', 28, 29, 30 and 28', 29', 30' (not depicted in the figure) arranged on the base plate 13 are all individually contactable via an appropriate line. A simplified equivalent circuit diagram for the second embodiment of a sensor arrangement is depicted in FIG. 7. FIG. 8 further provides a simplified depiction of the equivalent circuit diagram from FIG. 7.

With regard to FIG. 7, the respective parts 11A and 11B form the first sensor capacitance $C_{CS1}$ and the differential sensor device 11, and the two parts 12A and 12B form the second capacitive sensor device 12. In the circuit arrangement shown in FIG. 7, a few parasitic resistances are denoted by $R_{P1,pad}$ and capacitances by $C_{P1,pad}$ for the purpose of explanation. Furthermore, there may also be further parasitic elements that are not cited explicitly for the sake of simplicity. The resistance $R_{p1,MP}$ effectively corresponds to the resistance of the bearing device 30, which is preferably manufactured from a doped semiconductor material. In FIG. 6, the sensor capacitance $C_{CS2}$ and the parasitic capacitances $C_{LS2}$ and $C_{RS2}$ are indicated for the part 12A of the second sensor device 12.

In the simplified depiction of FIG. 8, it is possible to see from top to bottom the mirror plate 14 on which the movable capacitor elements 20, 20', 30 and 30' are arranged. The capacitor elements 20, 20', 30, 30' are made from doped silicon material, for example. The movement options are indicated by double-headed arrows. The respective pairs 18, 19; 18', 19'; 28, 29; 28', 29' of capacitor elements are mounted on the base plate 13. The wiring is denoted by 17. There are also integrated evaluation electronics provided beneath in the orientation of FIG. 8. Merely by way of example, the two differential reading devices 24, 31 are indicated, which have been operated as described for FIG. 5.

It is possible to see the first sensor device 11 and the second sensor device 12 and also the parasitic capacitances $C_{LS1}$, $C_{RS1}$, $C_{LS3}$, $C_{RS3}$, $C_{LS2}$, $C_{RS2}$, $C_{RS4}$ and $C_{LS4}$. The first sensor device 11 is operated using a first excitation signal $V_{ex1}$ and the second sensor device 12 is operated using the second excitation signal $V_{ex2}$. The two excitation signals $V_{ex1}$ and $V_{ex2}$ are produced in particular anti symmetrically in respect of an offset potential. The offset potential can correspond to the potential $V_{MP}$ of the mirror plate 14, for example. That is to say that the two excitation signals $V_{ex1}$ and $V_{ex2}$ are the same in terms of amplitude but have different arithmetic signs based on $V_{MP}$ and have synchronous characteristics. It can be said that the excitation signals are amplitude-balanced and synchronous. By way of example, as indicated in FIG. 8, this results in a charge accumulation on the basis of the parasitic capacitances $C_{LS1}$ and $C_{RS1}$ is indicated. Owing to the physical shape or other properties, a mean charge accumulation, denoted by +, arises on the capacitor element 20' on the basis of the parasitic capacitances $C_{LS3}$, $C_{RS3}$. Since the second excitation signal $V_{ex2}$ now has the opposite voltage, for example $V_{ex2}=-V_{ex1}$, negative charges arise that form on the basis of the parasitic capacitances $C_{LS4}$, $C_{RS4}$ and $C_{LS2}$ and $C_{RS2}$. In FIG. 8, this is indicated by a double minus -- and a single minus -. This charge can now be compensated for via the balancing path 27, which is effectively formed by the mirror plate MP. That is to say that the charges -- and - are balanced by the charges + and ++ and do not result in distortion of the charge measurement in the sensor signal path, which runs through the resistances $R_{P1,wire}$ and the sensor capacitances $C_{CS1}$, $C_{CS3}$, $C_{CS2}$ and $C_{CS4}$ in each case in FIG. 8.

For conventional actuations without balanced determination of the two actuation signals, the accumulated parasitic charges would have to drain via the relatively high resistance $R_{P1,MP}$. This is no longer necessary with adapted coupling of the excitation signals $V_{ex1}$ and $V_{ex2}$. Dissipation of the charges present on the parasitic capacitances $C_{LS4}$, $C_{RS4}$, $C_{LS2}$, $C_{RS2}$ via $R_{P1,MP}$ can at least be reduced. Normally, the resistance $R_{P1,\ MP}$ has a magnitude of a few kiloohms, whereas the wiring resistances $R_{P1,wire}$ are merely a few hundred ohms.

Examinations by the applicant have now revealed that, owing to the balanced actuation, that is to say that the first and second excitation signals are produced such that charges that are present on a parasitic capacitance associable with the first sensor device are at least partially compensated for by charges that are present on a parasitic capacitance associable with the second sensor device via a balancing signal path (outside the first or the second excitation signal path), and increased actuation frequency is possible. This means that it is possible for more reading pulses per time to be coupled in than conventionally.

Figure 9:
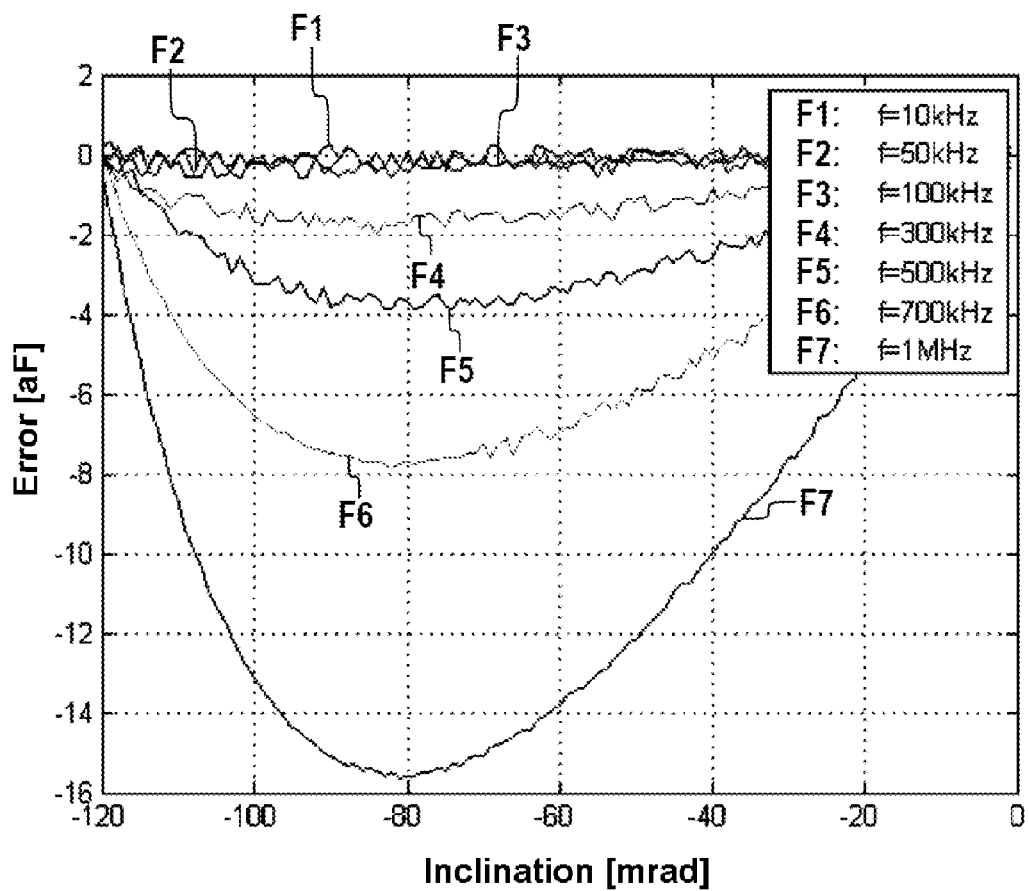
FIGS. 9 and 10 shows error curves for inclinations sensed using the second embodiment of a sensor arrangement at different excitation signal frequencies with and without "balanced" excitation.
Figure 10:
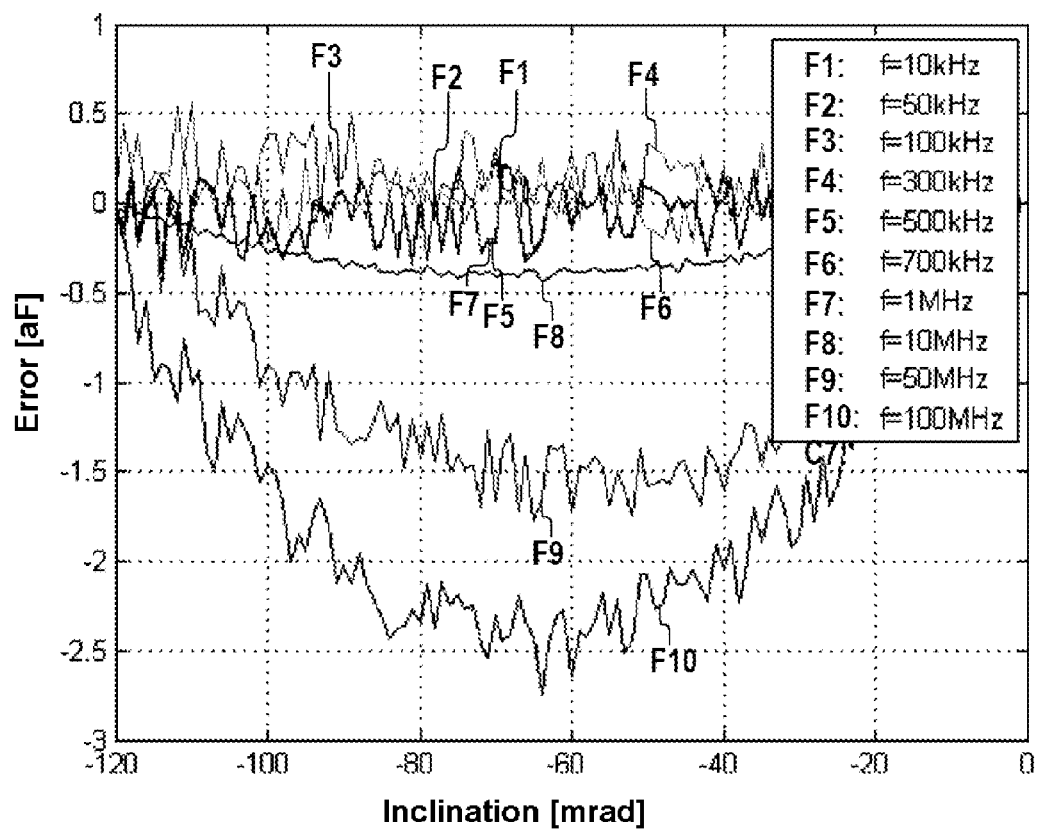

FIGS. 9 and 10 depict error curves that show a linearity error over an inclination angle. For an ideal characteristic curve, the respective sensor capacitance is directly proportional to a deflection, which in the present case corresponds to a tilt angle. The parasitic capacitances and resistances mean that deviations from this linearity arise that are indicated as errors in the unit of measure of capacitance [aF].

FIG. 9 now indicates 7 error curves F1 to F7 for different excitation frequencies between 10 kilohertz and one megahertz. For example, the respective excitation signals under consideration are square-wave signals with a duty ratio of 1:1. It can be seen that in the case of the curves F1 to F4, the absolute error is less than two aF. At higher frequencies, the error displays sharply, however. Standard sensor capacitances are between 40 and 80 fF. FIG. 9 shows the error in for an unbalanced actuation of the sensor devices from FIG. 7. That is to say that the two sensor devices 11A, 11B and 12A, 12B have been operated using the same excitation signal $V_{ex1}=V_{ex2}$.

In FIG. 10, the error for a balanced actuation, that is to say $V_{ex1}=-V_{ex2}$, no offset having been assumed, has now been computed for the equivalent circuit diagram depicted in FIG. 7. There are ten curves F1 to F10 indicated for excitation frequencies between 10 kilohertz and 100 megahertz. It can be seen that the balanced actuation produces a marked reduction in the absolute error in aF. In comparison with FIG. 9, the error at an excitation frequency of one megahertz (1 MHz) has been brought to less than 0.5 aF. Even at high frequencies, for example at f=1 megahertz (F7), the error is still below 0.5 aF. As a result, it can be seen that the proposed compensation for parasitic capacitances and resistances through antisymmetric actuation or coupling of the excitation signals allows a distinctly improved time constant for the measurements. That is to say that, in comparison with the conventional case, higher reading frequencies are possible and therefore a higher SNR can also be attained.

Examinations by the applicant have furthermore revealed that a further improvement can be attained if the excitation signals overshoot briefly. It is desirable to charge the capacitances that are present in the sensor arrangement as rapidly as possible, and to determine this using an evaluation circuit. That is to say that the voltage present on the output side of the sensor capacitance is meant to be brought quickly to a steady-state value that corresponds to the voltage of the excitation signal. To this end, a voltage signal having a prescribed nominal voltage characteristic is normally coupled as excitation signal over a prescribed excitation period. In this case, it is desirable for the value present with $V_{out1}$ and $V_{out2}$ at the output line node of the sensor capacitances in FIG. 1, for example, to adopt a steady-state value as quickly as possible that corresponds to the nominal voltage value. To achieve this, the excitation signal can temporarily—for example at the beginning of an excitation period—have a higher voltage value than the nominal voltage characteristic provides. Consequently, the capacitances are charged more quickly.

Figure 11A:
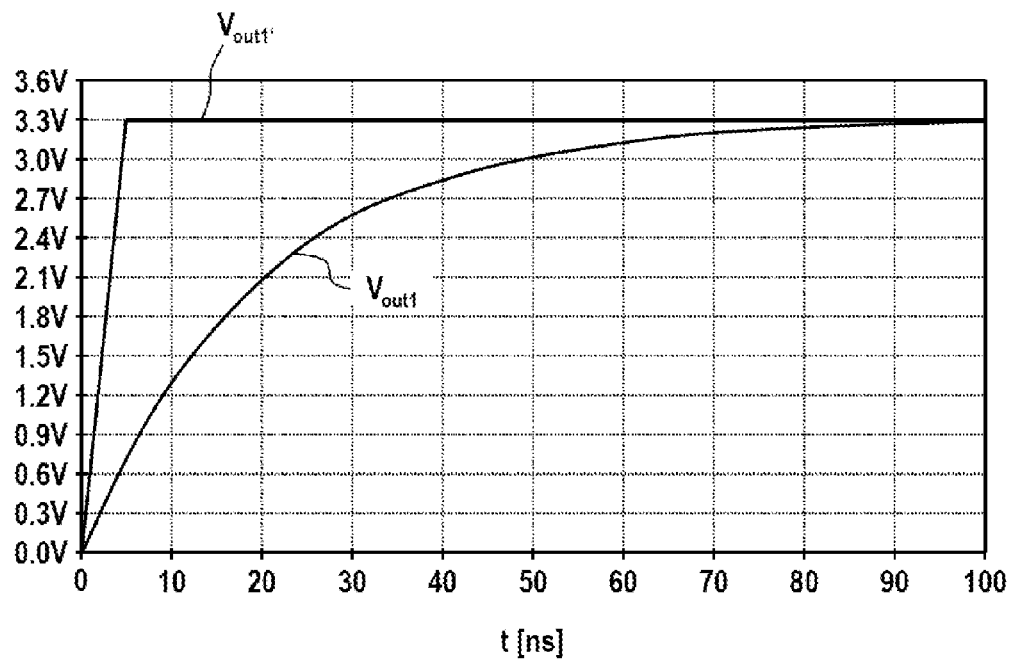
FIGS. 11A-11B show further exemplary signal shapes for excitation signals in a sensor arrangement.
Figure 11B:
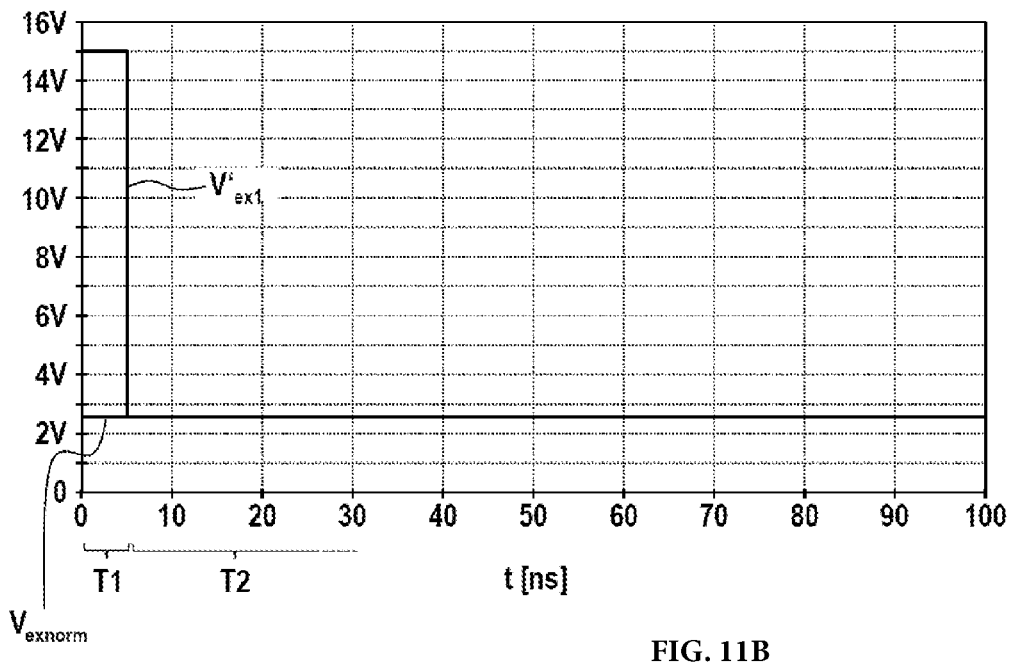

FIGS. 11A-11B depict two exemplary shapes for excitation signals. In the lower graph in FIG. 11B, a nominal voltage characteristic $V_{exnorm}$ is indicated that is constantly approximately 3.3 volts over an excitation period T1+T2. By way of example, the excitation frequency is then f=1/T, where T=100 ns 10 MHz. This results in a voltage characteristic $V_{out1}$ (cf. FIG. 1) as indicated in the upper graph of FIG. 11A. Only after approximately 50 nanoseconds does the voltage nestle up to a steady-state value of $V_{exnorm}$=3.3 volts. That is to say that the respective capacitor $C_{CS1}$ is fully charged only then. To reduce the charging time, the signal shape $V'_{ex1}$ depicted in the lower FIG. 11B) can be coupled in, for example. To this end, a much higher level, namely 15 volts, is applied over a first time period T1, resulting in faster charging of the capacitance $C_{CS1}$. Subsequently, in the section T2, the signal level $V'_{ex1}$ is kept at the nominal value of 3.3 volts. In the upper depiction in FIG. 11A, it can be seen that the high voltage at the beginning, that is to say during the section T1, $V_{out1}$ assumes the nominal voltage value of 3.3 volts after only 5 nanoseconds. That is to say that, in comparison with when a voltage signal $V_{ex1}$ is coupled in constantly, the time before a steady state is assumed is significantly reduced. This means that it is also possible for the accumulated measurement charge to be sensed more quickly.

Figure 12:
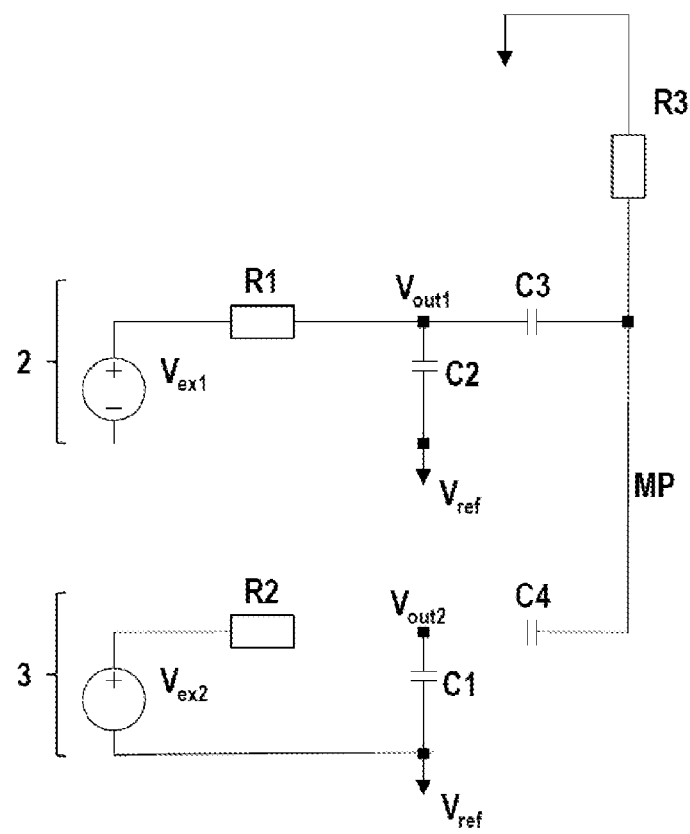
FIG. 12 shows a simplified schematic equivalent circuit diagram for a third embodiment of a sensor arrangement.

FIG. 12 schematically depicts a highly simplified equivalent circuit diagram for a third embodiment of a sensor arrangement. The first sensor device 2 is indicated with a sensor capacitance C2 and a second 3 is indicated with the sensor capacitance C1. The line resistances indicated are resistances R1 and R2. The resistances R1, R2 are 10 kiloohms, for example. The capacitances C3 and C4 are coupled to ground via a large resistance R3, which is 10 megaohms, for example. The line nodes at which the respective voltage can be tapped off are respectively denoted by $V_{out1}$ and $V_{out2}$.

Figure 13A:
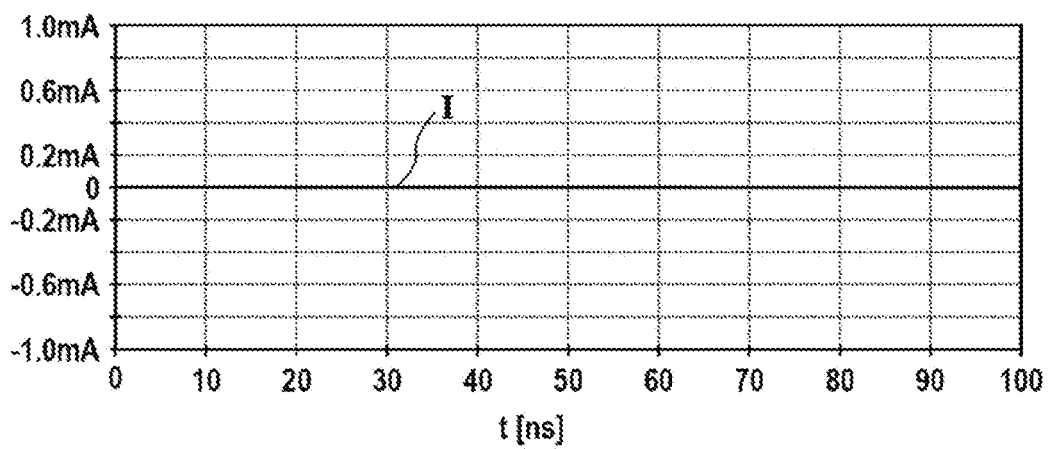
FIGS. 13A-13C shows further exemplary signal shapes for excitation signals in a sensor arrangement.
Figure 13B:
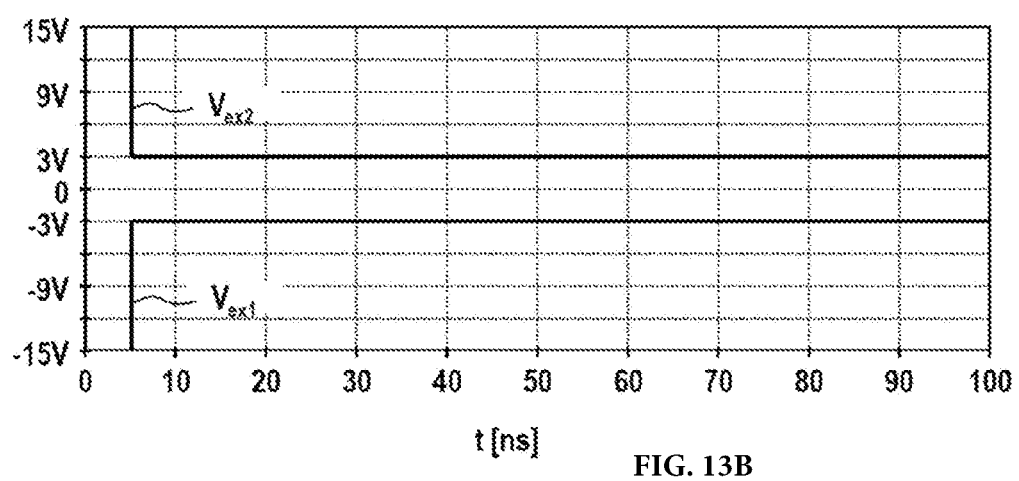
Figure 13C:
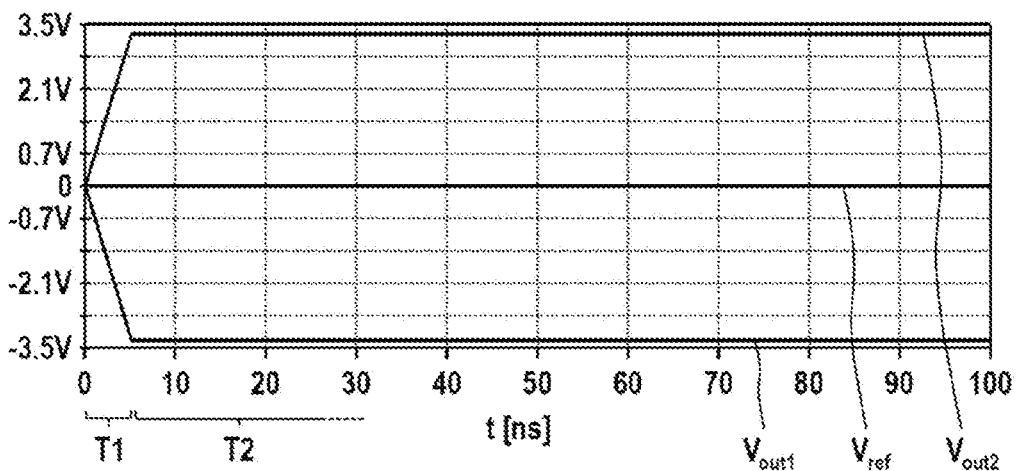

FIGS. 13A-13C show the time characteristic of the current I flowing via the resistance R3 (top depiction 13A)). The middle graph 13B) shows two balanced excitation signals $V_{ex1}$ and $V_{ex2}$ that are the inverse of one another. In the first time period T1, the signals are overdriven, as already indicated in FIG. 11A-11B. This results in the voltage characteristics depicted in the bottom graph 13C) at the line nodes for $V_{out1}$ and $V_{out2}$. It is possible to see firstly the overshoot in the time range T1 of the excitation period, which is approximately 100 nanoseconds in FIGS. 13A-13C, and secondly the balanced coupling-in of excitation signals. In the case of FIG. 13A-13C, the excitation signals $V_{ex1}$, $V_{ex2}$ for the two sensor devices 2, 3, which are depicted only extremely schematically, are the inverse of one another.

A method for operating a corresponding sensor arrangement, in particular a controller for the excitation signals, can involve a voltage value for the excitation signal that is increased in comparison with the nominal voltage being applied only until the nominal voltage is reached on the output side of the respective capacitor as a measurement voltage $V_{out1}$, $V_{out2}$. That is to say that the respective capacitor is charged with the measurement charge to be measured until $V_{out1}$ and $V_{out2}$ are 3.3 volts. As a result, the frequency at which a respective sensor device is read can be significantly increased.

All in all, the proposed measures allow a time constant that results from parasitic capacitances or resistances and limit a reading frequency to be significantly decreased. The measures further provide improved operation of lithographic systems in which actuators are used to move optical elements. The position of the latter can be ascertained quickly and with little effort by the sensor arrangements depicted here, so that actuation of the actuators is likewise improved. This results in a control loop with more efficient timing for positioning optical elements using capacitive sensors and actuators.

LIST OF REFERENCE SIGNS

1 Sensor arrangement
2, 3 Capacitive sensor device
4, 5 Reading device
6, 7 Operational amplifier
8 Control device
9 Line node
10 Sensor arrangement
11, 12 Differential capacitive sensor device
13 Base element
14 structural element 15 Bearing device
16 Evaluation electronics
17 Contacts
18, 19 Capacitor element (fixed)
20 Capacitor element (movable)
21 Analog-to-digital converter
22 Reference potential generator
23 Differential operational amplifier
24 Differential reading device
25 Control device
26 Supply lines
27 Balancing path
28, 29 Capacitor element (fixed)
30 Capacitor element (movable)
31 Differential reading device
100 Lithography system
100A EUV lithography system
102 Beam-shaping and illumination system
104 Projection system
106A Radiation source, EUV light source
108A EUV radiation
110 Mirror
112 Mirror
114 Mirror
116 Mirror
118 Mirror
120 Photomask
122 Wafer
124 Optical axis of the projection system
136 Mirror
M1-M6 Mirror
137 Vacuum housing
$C_i$ Integration capacitor
$C_{CS1}$ Sensor capacitor
$C_{LS1}, C_{RS1}$ Parasitic capacitance
$C_{CS1}$ Sensor capacitance
$C_{LS2}, C_{RS2}$ Parasitic capacitance
$C_{CS3}$ Sensor capacitance
$C_{LS3}, C_{RS3}$ Parasitic capacitance
$C_{CS4}$ Sensor capacitance
$C_{LS4}, C_{RS4}$ Parasitic capacitance
$C_{p1,pad}$ Capacitance
F1-F10 Error curves
GND Ground
MP Mirror plate
$R_{p1,MP}$ Resistance
$R_{p1,wire}$ Resistance
$R_{p1,pad}$ Resistance
$R_1, R_2, R_3$ Resistance
$S_1, S_2$ Switch
$V_{bias}$ Offset potential
$V_{ex1}, V_{ex2}$ Excitation signal
$Vd_{out1}$ Reading signal
$Vd_{out2}$ Reading signal
VSS Reference potential
$V_{ref}$ Reference potential
$V_{ex}$ Excitation signal
$V_{exnorm}$ Nominal excitation signal
$V_{out1}, V_{out2}$ Capacitor voltage

What is claimed is:

1. A sensor arrangement, comprising:
a first capacitive sensor device comprising a position-dependent variable first sensor capacitance configured to be sensed via a first excitation signal;
a second capacitive sensor device comprising a position-dependent variable second sensor capacitance configured to be sensed using a second excitation signal;
a first reading device associated with the first sensor device;
a second reading device associated with the second sensor device; and
a control device configured to produce the first and second excitation signals so that charges present on a parasitic capacitance associable with the first sensor device are at least partially compensated for by charges that are present on a parasitic capacitance associable with the second sensor device via a signal path outside of at least one signal path selected from the group consisting of the first excitation signal path and the second excitation signal path.

2. The sensor arrangement of claim 1, wherein the first excitation signal is an inverse of the second excitation signal.

3. The sensor arrangement of claim 1, wherein the first excitation signal is an inverse of the second excitation signal with regard to an offset potential.

4. The sensor arrangement of claim 1, wherein at least one signal selected from the group consisting of the first excitation signal and the second excitation signal is an AC voltage signal.

5. The sensor arrangement of claim 1, wherein at least one signal selected from the group consisting of the first excitation signal and the second excitation signal is a square-wave signal.

6. The sensor arrangement of claim 1, wherein at least one signal selected from the group consisting of the first excitation signal and the second excitation signal is a voltage signal comprising a prescribed nominal voltage characteristic over a prescribed excitation period.

7. The sensor arrangement of claim 6, wherein an amplitude of the voltage signal in a first excitation section of the excitation period is greater than a nominal amplitude corresponding to a nominal voltage characteristic.

8. The sensor arrangement of claim 7, wherein the amplitude of the voltage signal in a second excitation section corresponds to the nominal amplitude and the excitation period is defined by the first and second excitation sections.

9. The sensor arrangement of claim 6, wherein at least one signal selected from the group consisting of the first excitation signal and the second excitation signal corresponds to a reference potential between successive excitation periods over a prescribed pause period.

10. The sensor arrangement of claim 1, wherein an amplitude of the first and second excitation signals is settabled based on sensed parasitic capacitances.

11. The sensor arrangement of claim 1, further comprising:
a base element;
a structural element configured to retain an optical element; and
a bearing element configured to movably support the structural element on the base element.

12. The sensor arrangement of claim 1, wherein at least one sensor device selected from the group consisting of the first sensor device and the second sensor device comprises:
first and second capacitor elements fixed relative to one another; and
a third capacitor element movable relative to the first and second capacitor elements,
wherein the sensor capacitance appears between the first and second capacitor elements based on a position of the capacitor elements relative to each other, and the sensor capacitance is sensible via the excitation signal which is coupleable to the first and second capacitor elements via supply lines.

13. The sensor arrangement of claim 12, wherein the first and second capacitor elements are arranged on the base element, and the third capacitor element is arranged on the structural element.

14. The sensor arrangement of claim 12, wherein the first and second sensor devices are arranged in differential fashion, and the first and second sensor devices are arranged to sense two different tilt movements.

15. The sensor arrangement of claim 12, further comprising a fourth capacitor element, wherein:
the fourth capacitor element is movable relative to the first and second capacitor elements;
the first and second capacitor elements are individually contactable via supply lines in or on the base element; and
the sensor arrangement comprises a fourth the third capacitor element electrically coupled to one another via the structural element.

16. The sensor arrangement of claim 12, further comprising a fourth capacitor element wherein:
the first and second capacitor elements are arranged on the base element;
the third capacitor element is arranged on the structural element;
the first and second sensor devices are arranged in differential fashion;
the first and second sensor devices are arranged to sense two different tilt movements;
the fourth capacitor element is movable relative to the first and second capacitor elements;
the first and second capacitor elements are individually contactable via supply lines in or on the base element; and
the sensor arrangement comprises a fourth the third capacitor element electrically coupled to one another via the structural element.

17. The sensor arrangement of claim 1, wherein the signal path is outside the first excitation signal path.

18. The sensor arrangement of claim 1, wherein the signal path is outside the second excitation signal path.

19. A system, comprising:
an optical element; and
a sensor arrangement according to claim 1,
wherein the sensor arrangement is configured to position the optical element, and the system is a lithography system.

20. A method, comprising:
providing a lithography system comprising an optical element and a sensor arrangement configured to position the optical element, and the sensor arrangement comprising a sensor arrangement according to claim 1; and
producing the first and second excitation signals so that charges present on the parasitic capacitance associable with the first sensor device are at least partially compensated for by charges that are present on the parasitic capacitance associable with the second sensor device via a signal path outside at least one path selected from the group consisting of the excitation signal path first and the second excitation signal path;
sensing the first and second sensor capacitances; and
determining an inclination or position of the optical element based on the sensed first and second sensor capacitances.

* * * * *